US 6,608,259 B1

(12) United States Patent
Norskov

(10) Patent No.: US 6,608,259 B1
(45) Date of Patent: Aug. 19, 2003

(54) GROUND PLANE FOR A SEMICONDUCTOR CHIP

(75) Inventor: Soren Norskov, Copenhagen N (DK)

(73) Assignee: Nokia Mobile Phones Limited, Espoo (FI)

( * ) Notice: Subject to any disclaimer, the term of this patent is extended or adjusted under 35 U.S.C. 154(b) by 19 days.

(21) Appl. No.: 09/721,677

(22) Filed: Nov. 27, 2000

(30) Foreign Application Priority Data

Nov. 26, 1999 (GB) .............................. 9928080

(51) Int. Cl.⁷ .................................................. H05K 1/11
(52) U.S. Cl. ...................... 174/261; 174/259; 174/260; 361/306.3; 361/313; 361/321.2; 333/247; 257/532; 438/19
(58) Field of Search ............................... 174/250, 255, 174/259, 260, 264, 261; 361/767, 736, 760, 763, 783, 306.3, 312, 313, 321.2; 333/12, 247; 257/728, 532, 535; 438/19

(56) References Cited

U.S. PATENT DOCUMENTS

| | | | | |
|---|---|---|---|---|
| 4,736,521 A | * | 4/1988 | Dohya ........................ 29/830 |
| 4,954,197 A | * | 9/1990 | Jedlicka et al. .......... 156/273.7 |
| 5,309,324 A | * | 5/1994 | Herandez et al. ........... 361/734 |
| 5,475,317 A | * | 12/1995 | Smith ......................... 324/760 |
| 5,741,729 A | * | 4/1998 | Selna .................... 29/243.526 |
| 5,798,567 A | * | 8/1998 | Kelly et al. ................. 257/723 |
| 5,939,782 A | * | 8/1999 | Malladi ....................... 257/698 |
| 6,181,278 B1 | * | 1/2001 | Kakimoto et al. .... 343/700 MS |
| 6,388,207 B1 | * | 5/2002 | Figueroa et al. ............ 174/262 |
| 6,400,576 B1 | * | 6/2002 | Davidson .................... 361/763 |
| 6,407,929 B1 | * | 6/2002 | Hale et al. ................... 361/763 |

FOREIGN PATENT DOCUMENTS

| | | | |
|---|---|---|---|
| EP | 0630176 | 12/1994 | ............ H05K/7/20 |
| GB | 2118371 | 10/1983 | |

* cited by examiner

Primary Examiner—Kamand Cuneo
Assistant Examiner—José H. Alcalá
(74) Attorney, Agent, or Firm—Antonelli, Terry, Stout & Kraus, LLP

(57) ABSTRACT

AC-ground plane is for a semiconductor chip adapted to be mounted on a supporting member in a chip package, wherein said ground plane comprises at least one first capacitor plate provided within said chip, and at least one second capacitor plate provided on said supporting member, said first and second capacitor plate being separated by a dielectric layer and capacitively coupled to each other via this layer, and said ground plane comprising at least one first conducting member, said first conducting member being at least one electrically conducting via extending through said supporting member and electrically coupled in series with said second capacitor plate.

20 Claims, 3 Drawing Sheets

GROUND PLANE FOR A SEMICONDUCTOR CHIP

BACKGROUND OF THE INVENTION

1. Field of the Invention

The present invention relates to the design and production of integrated circuits and to the packaging of such circuits, more specifically the invention relates to a ground plane for a semiconductor chip for mounting on a supporting member in a chip package.

2. Description of the Prior Art

In all analog circuit designs it is desirable to have a ground that is as close to 0 volts AC as possible. Normally circuit design assumes that ground nodes do not carry any AC-voltage. If a ground node, contrary to this assumption, does carry an AC-voltage, this may lead to unpredictable behavior, e.g. increased noise, distortion or even instability. The root cause of this is that all conductors have a non-zero impedance. This means that when a ground node has to source or sink a current there will be a voltage drop between the ground node and the actual ground point. This effect is much more pronounced in RF-circuits because the inductive nature of the impedance.

In integrated circuits the ground point of the die (semiconductor chip) is connected to the exterior via a bonding wire connected between the die and the interposer (or leadframe). The impedance of the bonding wire is important at RF-frequencies, and this makes it difficult to realize a proper ground node on the die. If the die is made bigger in order to make the bonding wire shorter, this only moves the problem from the bonding wire to the die because the conductor on the die has to be longer.

Several solutions have been proposed to solve this problem. One is to make the C-package very small and the bonding wires short. This solution has several drawbacks. It is only viable for small scale integration circuits. In large scale integration circuits the die is larger and the ground conductors on the die are correspondingly longer. Moreover for small scale integrated circuits making the bonding wires short only reduces the problem, but does not solve it.

Another solution is to have multiple conductors in parallel. This is often used in RF-PA-stages, but is not really practical for large scale integrated circuits as the multiple connections take up a lot of space

SUMMARY OF THE INVENTION

According to a first aspect of the invention, an AC-ground plane is provided for a semiconductor chip for mounting on a supporting member in a chip package, wherein the ground plane comprises at least one first capacitor plate provided within the chip, and at least one second capacitor plate provided on the supporting member, the first and second capacitor plate being separated by a dielectric layer and capacitively coupled to each other via this layer, and the ground plane comprising at least one first conducting member, the first conducting member being at least one electrically conducting via extending through the supporting member and electrically coupled in series with the second capacitor plate.

According to a second aspect of the invention, an AC-ground plane is provided for a semiconductor chip for mounting on a supporting member in a chip package, comprising a capacitor and an inductor having a resonant frequency which approximately equals the working frequency of the integrated circuit.

A third aspect of the invention is a method for providing a tuned RF-ground plane for a semiconductor chip mounted on a supporting member in a chip package. The method includes steps of providing a metal covered area on the surface of the supporting member, and providing a number of vias electrically connected to the metal covered area and extending therefrom through the supporting member to the opposite side thereof, connecting in parallel at least two of the number of vias.

In general terms according to the present invention the problem is solved by placing a metal-covered area on the interposer under the die. Vias on the interposer connect the area to the underside of the interposer. The die is glued to the area with electrically conducting glue. A capacitor is thus formed, the capacitor being formed by the die substrate, the oxide layer on the underside of the die, and the conductive plate on the interposer. By making all other associated impedances as small as possible, e.g. by connecting the metal-plate on the top side of the interposer to the bottom side by using multiple vias in parallel, the resulting impedance can be made very low, less than 20 Ohms, even at high frequencies. If the integrated circuit has a well defined working frequency, the RF-ground plane can be tuned to that frequency by choosing the dimensions of the associated conductors, and thus the inductance of the conductors, so that the resonant frequency of the inductance and capacitor coincides with the working frequency. The impedance at said working frequency can be made extremely low, close to 2 Ohms.

According to a third aspect of the invention, there is provided a semiconductor chip package comprising a semiconductor chip and a supporting member, the supporting member comprising at least one metal covered area and at least one electrically conductive via extending from the metal covered area through the supporting member. The semiconductor chip package is attached to the supporting member by means of conductive glue which is in electrical contact with the metal covered area.

The invention will now be described in more detail, by means of the drawings, which show non-limiting exemplary embodiments of the invention.

DETAILED DESCRIPTION OF THE INVENTION

Figure 1:
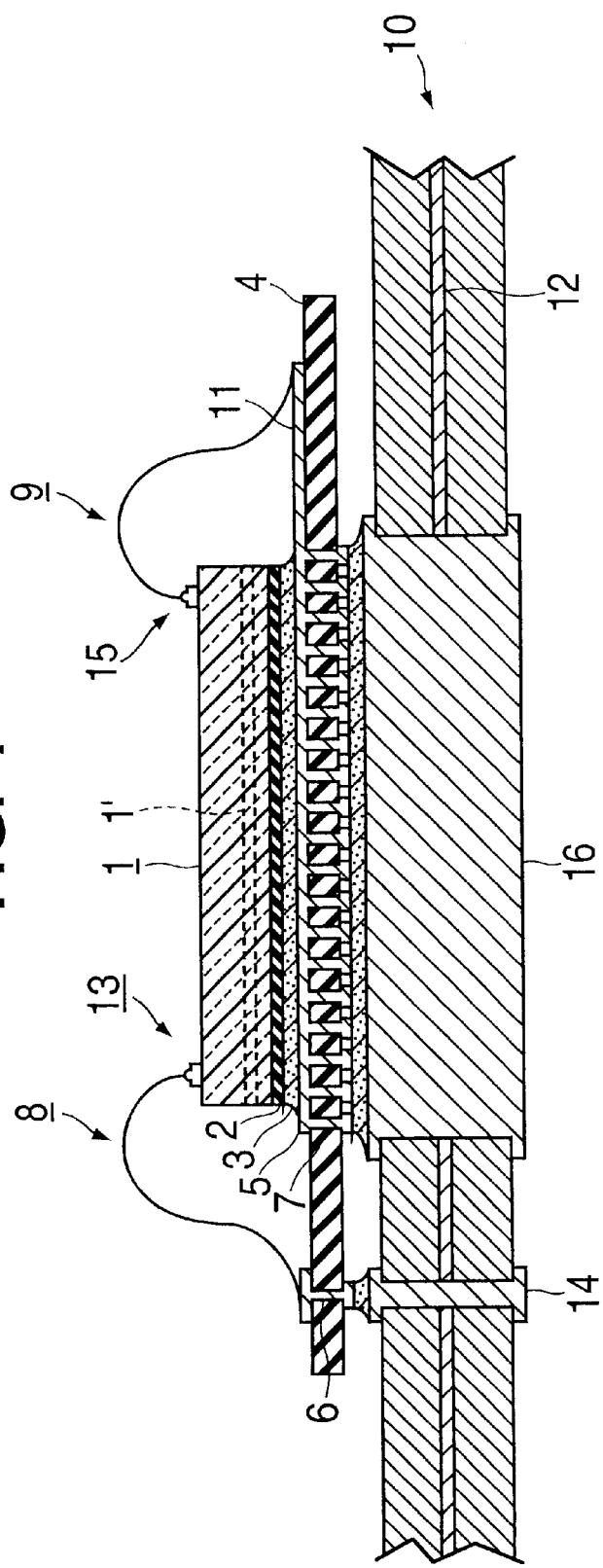
FIG. 1 schematically shows a cross section of the preferred embodiment of a semiconductor chip and interposer assembly of an integrated circuit package according to the invention in a situation where the assembly is mounted on a printed circuit board (PCB).

Referring first to FIG. 1, there is shown a semiconductor chip 1. The semiconductor chip includes an insulating layer 2. Typically this layer 2 is an integrally formed layer comprising an oxide of the semiconductor material, i.e. silicon dioxide if the chip is made from silicon. The dielectric coefficient of silicon dioxide is approximately 3.9.

The chip 1 is glued to an insulating interposer 4 carrying a conductive area 5. Typically the conductive area 5 is a metal covered area. The glue 3 is electrically conductive and serves not only the purpose of adhering the chip 1 to the interposer 4, but also forms a capacitor plate, capacitively coupled to internal parts (not shown) of the chip, but insulated therefrom by the insulating layer 2.

In the following these internal parts are referred to as capacitor plates regardless of their actual shape, i.e. all current carrying parts within the chip are considered as forming capacitor plates.

From the conductive area 5 on the surface of the interposer 4 a number of vias 7 extend through the interposer 4 to the opposite surface thereof, where they contact a printed circuit board (PCB) 10.

In this respect it should be noted that even though the metal coated area in the embodiments shown corresponds largely to the dimensions of the chip this is not a prerequisite for the invention to work. Instead, because the electrically conductive glue defines the capacitor plate vis-à-vis the internal parts, it is in principle sufficient to contact the glue 3 to the vias 7.

Even though the metal covered area 5 on the interposer 4 could provide the capacitor plate directly, i.e. instead of providing the capacitor plate by means of conductive glue 3, this is less desirable.

There are several reasons for this. Using a non-conductive glue between the chip 1 and the metal covered area 5, increases the thickness of the dielectric insulating material between the capacitor plates and thus decreases the capacitance value for the capacitor $C_5$ thus formed. Further the thickness of the glue will be much less well defined than the thickness of the insulating layer 2, such as a silicon dioxide layer, on the chip, which, due to the precision in the manufacturing process for the chip 1, may be made very thin and well defined.

The capacitance value has been found to be approximately ten times higher when using electrically conductive glue as compared to non-conductive glue.

Thus without the electrically conductive glue 3 the capacitance value becomes both smaller and less predictable.

The vias 7 form a conducting member which connects the second capacitor plate to an exterior ground node according to the invention.

Though each via 7 at the frequencies of interest only exhibits a relatively small impedance, in the applications of the invention having a large number of vias 7 coupled in parallel in order to lower the impedance further over a range of frequencies is important.

Thus, in order to have as many vias 7 as possible and the best possible electrical connection from the glue to the vias, a large metal covered area, preferably formed integrally with the vias 7 is desirable.

It is known that any conducting member exhibits an inductance. Thus, a LC series circuit is formed by the capacitance provided between internal parts of the chip and the conductive glue 3 separated by the dielectric layer 2, and the inductance provided by the vias 7. If the chip has a well defined working frequency, the number of vias may be chosen, so that the series resonant frequency of the inductance provided by the vias and the aforementioned capacitance, approximately matches the working frequency of the chip. In this way an extremely low ground impedance of 2 Ohms or less, can be achieved.

It should be noted that the vias 7 in the preferred embodiment are not connected in parallel directly on the supporting interposer 4. Instead they are, as shown in FIG. 1, connected in parallel via the conductive paths 16 on the printed circuit board 10 on which the hip package, containing the chip 1 and interposer 4 assembly according to the invention, is eventually mounted.

This illustrates one way of connecting the vias 7 in parallel, and numerous other ways may be devised by the skilled person.

In particular it should be noted, that the resonant frequency of the ground plane is influenced by the number of vias 7 actually connected in parallel for a given application, and by the way this is done, as well as by the inductance of the die and the layout of the PCB 10.

Further, as shown in FIG. 1, a number of DC ground paths may be provided.

A ground pad 13 is connected to a via 6 through a bonding wire 8 which in turn is connected to the PCB ground plane 12 by via 14. The impedance of this path is essentially inductive at the frequencies of interest.

Another ground pad 15 is connected to conducting member 11 on interposer 4 through bonding wire 9 which is connected to the PCB ground plane 12 by vias 7. Either, or both, of the above described DC ground paths may be used. It should be noted that most circuits require at least one DC ground path.

The DC ground paths may also b e used for AC signals if very low ground impedance is not required.

Figure 2:
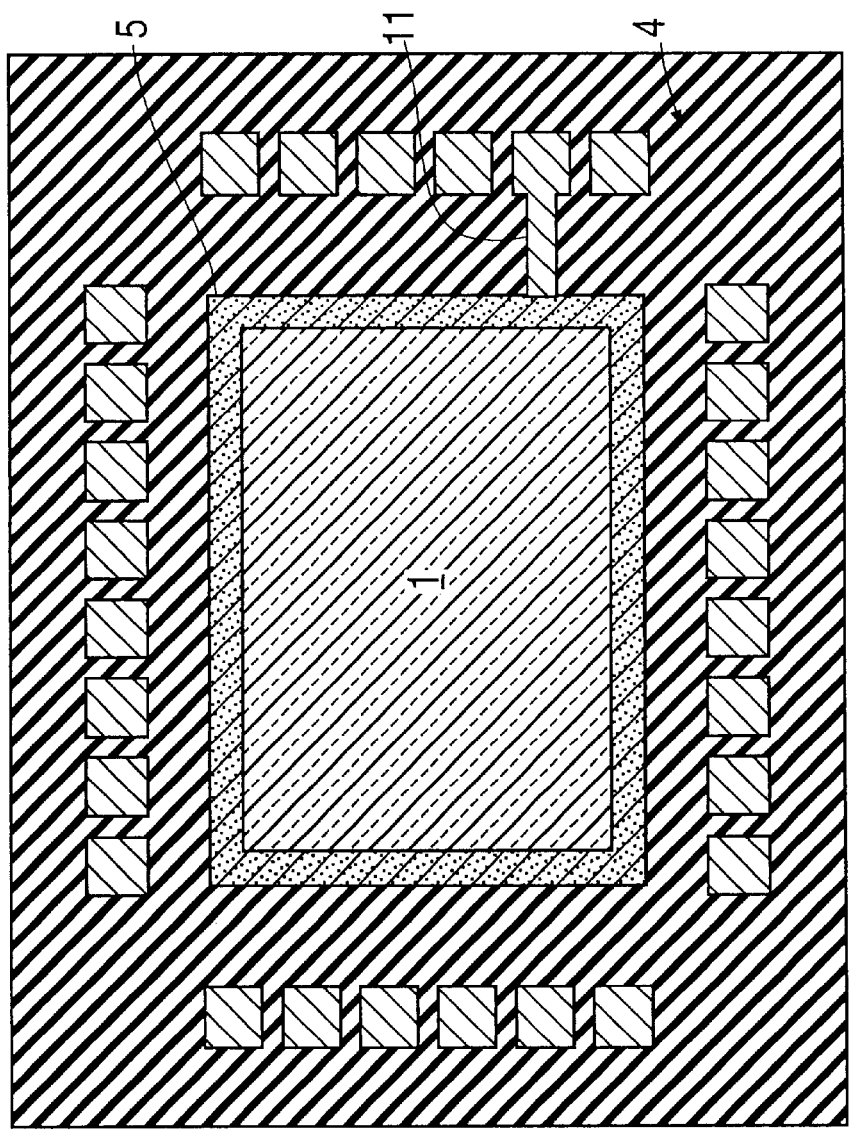
FIG. 2 shows a top plan view of the chip and interposer assembly of FIG. 1.

The components in FIG. 2 are identified by the same reference numerals as used in FIG. 1. Thus $L_8$ is the inductance of the bonding wire 8, $L_{14}$ the inductance of the via 14, $C_5$ the capacitance between internal parts of the chip 1 and the capacitor plate provided by the glue 3, $L_g$ the inductance of bondwire 9, $L_{11}$ the inductance of conducting member 11 on interposer 4, and $L_7$ the combined inductance of the vias 7, when they are eventually connected in parallel.

Figure 4:
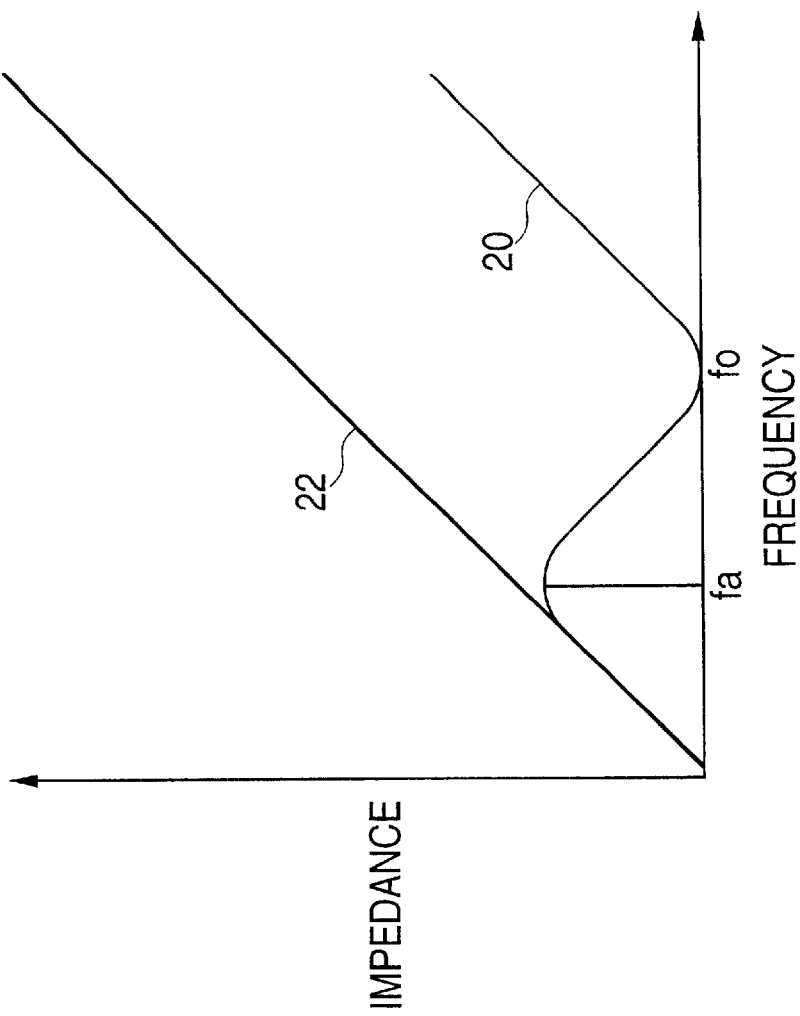
FIG. 4 schematically shows impedance characteristics for the bonding wire and via, and the total impedance, respectively, for the preferred embodiment.
Figure 3:
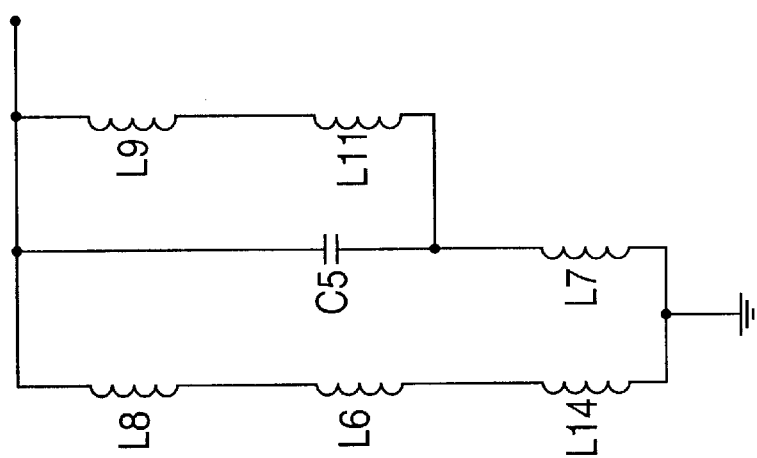
FIG. 3 schematically shows an electric circuit diagram for the LC series circuit of the chip and interposer assembly of FIG. 1.

FIG. 4 illustrates the difference between the impedance to ground when an AC-ground plane according to the invention is used (line 20), and when only the inductive DC ground is used (line 22). Both axes are logarithmic. In particular the dip in impedance at $f_0$ should be noted, since at this specific frequency the impedance of the ground path becomes virtually zero. Thus if this frequency $f_0$ matches the operating frequency of the chip, a very low impedance ground path is provided for the chip. However, even if $f_0$ is not tuned to the working frequency of the circuit, the ground impedance obtained by using the AC-ground plane is still much lower with the invention than without the invention when working frequency of the circuit is greater than $f_a$ It has been found that using the an AC-ground plane according to the invention there may be provided a substantial noise reduction at desired frequencies.

What is claimed is:

1. An assembly of a ground plane and a semiconductor chip, comprising:

at least one first capacitor plate provided within the semiconductor chip, and at least one second capacitor plate, the first and second capacitor plates being separated by a dielectric layer and capacitively coupled to each other via the dielectric layer, and the ground plane comprising at least one first conducting member and at least one electrically conducting via extending through a supporting member of the semiconductor chip and electrically coupled in series with the second capacitor plate; and wherein the second capacitor plate comprises a layer of electrically conductive glue which attaches the ground plane to the semiconductor chip.

2. An assembly according to claim 1, wherein:

a resonant frequency of the capacitance provided by the first capacitor plate and the second capacitor plate, and an inductance provided by the at least one first conducting member, is approximately equal to an intended working frequency of the chip.

3. An assembly according to claim 1, wherein:

the dielectric layer is an integral part of the chip.

4. An assembly according to claim 2, wherein:

the dielectric layer is an integral part of the chip.

5. An assembly according to claim 3, wherein:

the dielectric layer is an outer surface of the chip facing the supporting member.

6. An assembly according to claim 4, wherein:

the dielectric layer is an outer surface of the chip facing the supporting member.

7. An assembly according to claim 3, wherein:

the dielectric layer comprises silicon oxide.

8. An assembly according to claim 4, wherein:

the dielectric layer comprises silicon oxide.

9. An assembly according to claim 1, wherein:

the second capacitor plate comprises a metallic layer on the supporting member which electrically contacts the layer of electrically conductive glue.

10. An assembly according to claim 2, wherein:

the second capacitor plate comprises a metallic layer on the supporting member which electrically contacts the layer of electrically conductive glue.

11. An assembly according to claim 2 wherein:

the second capacitor plate comprises a metallic layer on the supporting member which electrically contacts the layer of electrically conductive glue.

12. An assembly according to claim 2, wherein:

the second capacitor plate comprises a metallic layer on the supporting member which electrically contacts the layer of electrically conductive glue.

13. An assembly according to claim 2, wherein:

the second capacitor plate comprises a metallic layer on the supporting member which electrically contacts the layer of electrically conductive glue.

14. An assembly according to claim 2, wherein:

the second capacitor plate comprises a metallic layer on the supporting member which electrically contacts the layer of electrically conductive glue.

15. An assembly according to claim 2, wherein:

the second capacitor plate comprises a metallic layer on the supporting member which electrically contacts the layer of electrically conductive glue.

16. An assembly according to claim 2, wherein:

the second capacitor plate comprises a metallic layer on the supporting member which electrically contacts the layer of electrically conductive glue.

17. An assembly according to claim 1, wherein:

the at least one electrically conducting via extending through the supporting member is directly connected to the second capacitor plate.

18. An assembly according to claim 9, wherein:

the vias and the metallic layer are integrally formed from a same metal.

19. A method of assembly of a ground plane and a semiconductor chip mounted on a supporting member of a chip containing a first capacitor plate and a dielectric coating, comprising providing the ground plane on a metal covered area on a surface of the supporting member, providing vias electrically connected to the metal covered area and extending therefrom through the supporting member to the opposite side thereof, connecting in parallel at least two of the vias which provide an inductance and are coupled to the ground plane, and using an electrically conductive glue between the chip and the metal covered area to attach the metal covered area to the chip.

20. A semiconductor chip package comprising:

a semiconductor chip containing a first capacitor plate and a dielectric coating and a supporting member, the supporting member comprising at least one metal covered area which is a ground plane and at least one electrically conductive via extending from the metal covered area through the supporting member which provides an inductance and are coupled to the ground plane, and wherein the chip is adhered to the supporting member by means of an electrically conductive glue and the electrically conductive glue is in electrical contact with the metal covered area and the electrically conductive glue is a second capacitor plate and the first and second capacitor plates and the dielectric form a capacitor and the capacitance and inductance comprise a series circuit coupling the capacitance to ground.

* * * * *